(12) United States Patent
Kim et al.

(10) Patent No.: US 9,520,550 B2
(45) Date of Patent: Dec. 13, 2016

(54) ELECTRONIC DEVICE

(71) Applicant: SK hynix Inc., Icheon-Si (KR)

(72) Inventors: Chi-Ho Kim, Icheon-si (KR);
Sung-Joon Yoon, Icheon-Si (KR);
Guk-Cheon Kim, Icheon-Si (KR);
Seung-Mo Noh, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/852,373

(22) Filed: Sep. 11, 2015

(65) Prior Publication Data

US 2016/0308113 A1    Oct. 20, 2016

(30) Foreign Application Priority Data

Apr. 14, 2015  (KR) .................. 10-2015-0052367

(51) Int. Cl.
*H01L 43/02* (2006.01)
*H01L 43/08* (2006.01)

(52) U.S. Cl.
CPC .............. *H01L 43/02* (2013.01); *H01L 43/08* (2013.01)

(58) Field of Classification Search
CPC ........... H01L 43/02; H01L 43/08; H01L 29/82
See application file for complete search history.

(56) References Cited

U.S. PATENT DOCUMENTS

| | | | | |
|---|---|---|---|---|
| 5,737,156 A * | 4/1998 | Bonyhard | ............... | G01R 33/09 360/327.11 |
| 6,950,369 B2 * | 9/2005 | Kunikiyo | ............... | B82Y 10/00 365/158 |
| 7,139,156 B1 * | 11/2006 | Helms | .................... | G01R 33/09 360/327.1 |
| 7,200,033 B2 * | 4/2007 | Braun | ................... | H01L 27/222 257/E27.005 |
| 7,262,069 B2 * | 8/2007 | Chung | .................... | G11C 11/16 257/295 |
| 7,372,116 B2 * | 5/2008 | Fullerton | ................ | G11C 11/16 257/421 |
| 7,502,249 B1 * | 3/2009 | Ding | ........................ | G11C 11/16 365/158 |
| 7,525,862 B1 * | 4/2009 | Sun | ......................... | G11C 11/14 365/158 |
| 7,683,446 B2 * | 3/2010 | Koga | ..................... | B82Y 10/00 257/421 |
| 7,973,630 B2 * | 7/2011 | Masai | ................. | H01F 17/0006 257/275 |
| 8,199,564 B2 | 6/2012 | Zheng et al. | | |
| 8,570,792 B2 | 10/2013 | Chiang et al. | | |
| 8,885,395 B2 * | 11/2014 | Zhou | ..................... | G11C 11/161 365/148 |
| 9,013,838 B1 * | 4/2015 | Erie | ......................... | G11B 5/33 360/327 |
| 9,117,521 B2 * | 8/2015 | Guillemenet | ......... | G11C 11/161 |

(Continued)

*Primary Examiner* — Earl Taylor
(74) *Attorney, Agent, or Firm* — Perkins Coie LLP

(57) ABSTRACT

An electronic device is provided to include a semiconductor memory including a variable resistance element. The variable resistance element may include a variable resistance pattern including a first electrode layer, a variable resistance layer, and a second electrode layer that are sequentially stacked; and a switching assist structure spaced from a side wall of the variable resistance pattern to surround the variable resistance pattern and including multilayered conductive structures that are vertically spaced from one another.

22 Claims, 10 Drawing Sheets

(56) References Cited

U.S. PATENT DOCUMENTS

| | | | | |
|---|---|---|---|---|
| 9,153,771 B2* | 10/2015 | Nakada | | H01L 43/02 |
| 2005/0093669 A1* | 5/2005 | Ahn | | H01F 5/003 |
| | | | | 336/200 |
| 2006/0114713 A1* | 6/2006 | Braun | | H01L 27/222 |
| | | | | 365/158 |
| 2006/0273418 A1* | 12/2006 | Chung | | G11C 11/16 |
| | | | | 257/421 |
| 2008/0043517 A1* | 2/2008 | Ikarashi | | G11C 11/15 |
| | | | | 365/158 |
| 2008/0112087 A1* | 5/2008 | Clinton | | G11B 5/02 |
| | | | | 360/317 |
| 2008/0272448 A1* | 11/2008 | Dahmani | | B82Y 10/00 |
| | | | | 257/421 |
| 2008/0291720 A1* | 11/2008 | Wang | | G11C 11/16 |
| | | | | 365/173 |
| 2008/0291721 A1* | 11/2008 | Apalkov | | G11C 11/16 |
| | | | | 365/173 |
| 2010/0034008 A1* | 2/2010 | Wang | | G11C 11/16 |
| | | | | 365/145 |
| 2013/0241543 A1* | 9/2013 | Stenson | | G01R 33/096 |
| | | | | 324/252 |
| 2014/0010003 A1* | 1/2014 | Zhou | | G11C 11/165 |
| | | | | 365/158 |
| 2014/0062646 A1* | 3/2014 | Morrissey | | H01F 27/24 |
| | | | | 336/233 |
| 2014/0153324 A1* | 6/2014 | Yu | | H01L 43/08 |
| | | | | 365/158 |
| 2014/0169083 A1* | 6/2014 | Wang | | G11C 11/161 |
| | | | | 365/158 |
| 2014/0231940 A1 | 8/2014 | Xia et al. | | |
| 2014/0247653 A1* | 9/2014 | Wang | | H01L 43/08 |
| | | | | 365/158 |
| 2014/0269003 A1* | 9/2014 | Guillemenet | | G11C 11/161 |
| | | | | 365/148 |
| 2014/0353785 A1* | 12/2014 | Paci | | H01L 27/22 |
| | | | | 257/427 |
| 2015/0009744 A1* | 1/2015 | Di Pendina | | G11C 14/0081 |
| | | | | 365/148 |
| 2015/0084140 A1* | 3/2015 | Satoh | | H01L 27/222 |
| | | | | 257/421 |
| 2015/0084671 A1* | 3/2015 | Prenat | | H03K 19/0033 |
| | | | | 326/9 |
| 2015/0311252 A1* | 10/2015 | Gan | | H01L 43/08 |
| | | | | 257/421 |
| 2015/0332748 A1* | 11/2015 | Wang | | G11C 11/161 |
| | | | | 365/158 |
| 2015/0340594 A1* | 11/2015 | Liou | | H01L 43/02 |
| | | | | 257/48 |

\* cited by examiner

ELECTRONIC DEVICE

CROSS-REFERENCE TO RELATED APPLICATIONS

This patent document claims priority and benefits of Korean Patent Application No. 10-2015-0052367, entitled "ELECTRONIC DEVICE" and filed on Apr. 14, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which operation characteristics are improved by providing two independent but collaborative switching mechanisms in each variable resistance elements.

In one aspect, an electronic device is provided to include a semiconductor memory. The semiconductor memory may include a variable resistance element including the variable resistance pattern including a first electrode layer, a variable resistance layer and a second electrode layer that are sequentially stacked; and a switching assist structure spaced from a side wall of the variable resistance pattern to surround the variable resistance pattern and including multilayered conductive structures that are vertically spaced from one another.

In some implementations, one end of the switching assist structure may be electrically coupled to the first electrode layer or the second electrode layer. In some implementations, the multilayered conductive structures of the switching assist structure each may include a single conductive line shape and may be coupled in series between a first node of one end of the switching assist and a second node of the other end thereof. In some implementations, the switching assist structure may have a spiral shape. In some implementations, the switching assist structure may include a plurality of ring-type conductive layers, and a plurality of electrically conductive connectors electrically coupled to the plurality of the ring-type conductive layers. In some implementations, each of the plurality of ring-type conductive layers may include a "C" shape of which a side of one end is spaced to face a side of the other end. In some implementations, the plurality of electrically conductive connectors may couple the plurality of ring-type conductive layers such that directions of current flowing through the plurality of ring-type conductive layers are the same with one another.

In another aspect, an electronic device is provided to include a variable resistance element including a variable resistance pattern including a first electrode layer and a second electrode layer that are separated from each other to receive a first current to flow through, and the variable resistance pattern between the first and second electrode layers to include a storage layer exhibiting a variable magnetization that can be changed by the first current when above a required current value, a reference layer exhibiting a fixed magnetization and spaced from the storage layer, and a tunnel barrier layer between the storage and reference layers, wherein the variable resistance pattern shows different resistance values to the first current based on a direction of the variable magnetization relative to the fixed magnetization; and a switching assist structure, located adjacent to the variable resistance element, structured to receive a second current and to produce a magnetic field at the variable resistance pattern in response to the second current to assist a switching of the variable magnetization of the variable resistance pattern under a switching operation caused by the first current when under the required current value.

In some implementations, the switching assist structure may include a plurality of ring-type conductive layers vertically spaced from one another along a direction from the first electrode layer to the second electrode layer of the variable resistance element; and conductive connectors electrically coupling the conductive layers. In some implementations, the plurality of ring-type conductive layers and the conductive connectors may form a spiral shape. In some implementations, each of the conductive layers may have a discontinuous shape having an opening portion. In some implementations, the plurality of ring-type conductive layers and the conductive connectors may surround the variable resistance pattern. In some implementations, the ring-type conductive layers may have the same inner diameter. In some implementations, the ring-type conductive layers may have different inner diameters from one another. In some implementations, the ring-type conductive layers may have the same thickness. In some implementations, the ring-type conductive layers may have different thicknesses from one another. In some implementations, the ring-type conductive layers may have the same interval. In some implementations, the ring-type conductive layers may have different intervals from one another. In some implementations, the ring-type conductive layers may be formed to have a slope with respect to the direction of the first current passing through the variable resistance pattern. In some implementations, the slope may be in a range of 15° to 75°. In some implementations, the variable resistance layer may include a magnetic tunnel junction in which a tunnel barrier is interposed between two magnetic materials. In some implementations, the electronic device may further comprising a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further comprising a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further comprising a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further comprising a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further comprising a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electric device is provided to include a variable resistance element including a variable resistance pattern in which a first electrode layer, a storage layer, a tunnel barrier layer, a reference layer and a second electrode layer are sequentially stacked, and a switching assist which includes multilayered conductive structures spaced from a side wall of the variable resistance pattern to surround the variable resistance pattern and vertically spaced from one another, In another aspect, an electronic device is provided to include a plurality of first conductive lines and a plurality of second conductive lines crossing one another; and memory cells coupled to the plurality of first conductive lines and the plurality of second conductive lines to form an memory array, each memory cell including a selection element and a variable resistance element coupled in series and the selection element operable to select a respective memory cell to electrically coupled to respective first and second conductive lines. The variable resistance element within each memory cell may include a variable resistance pattern having a first electrode layer, a storage layer, a tunnel barrier layer, a reference layer and a second electrode layer which are sequentially stacked, wherein the storage layer exhibits a variable magnetization that can be changed by a current flowing through the variable resistance pattern when above a required current value or a magnetic field; and a switching assist structure including conductive structures that surround the variable resistance pattern and are electrically connected to each other to receive a switching assist current to produce a switching assist magnetic field at the storage layer to assist switching of the variable magnetization of the storage layer when under a switching operation caused by the current flowing through the variable resistance pattern when under the required current value, wherein each selection element and each variable resistance element are electrically coupled through the switching assist structure.

In some implementations, the conductive structures may be ring shaped to surround the variable resistance pattern. In some implementations, the switching assist structure may include a portion adjacent to the first electrode layer and coupled to the first electrode layer, and another portion adjacent to the second electrode layer and coupled to the selection element.

According to the embodiments, since the variable resistance element of a semiconductor memory includes a switching assist structure, it is possible to reduce the driving current needed for the variable resistance element to be switched between different resistant states.

DETAILED DESCRIPTION

Figure 1:
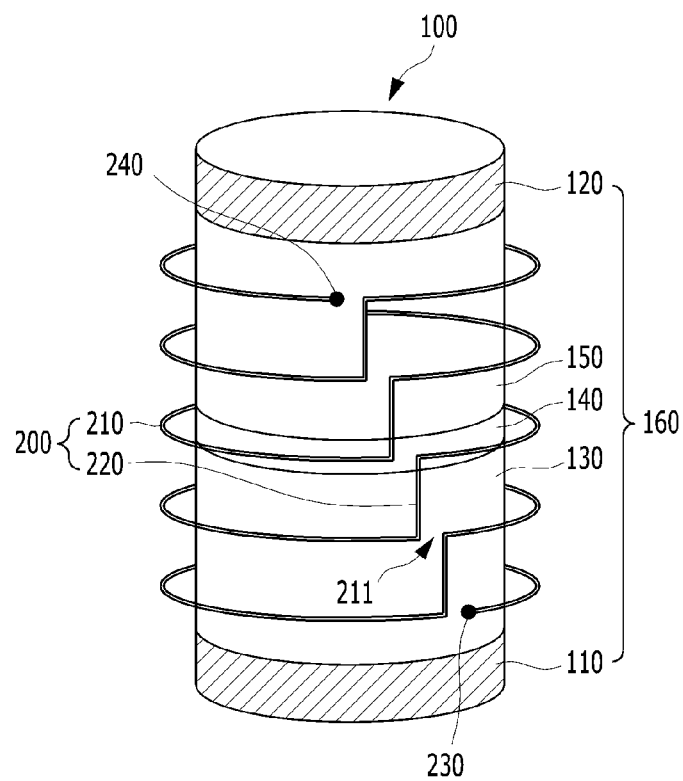
FIGS. 1 and 2 are views schematically illustrating an example of a variable resistance element of a semiconductor memory in accordance with a first implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

As described later, the disclosed technology in this patent document includes an electronic device including a semiconductor memory in which operation characteristics are improved. Here, the semiconductor memory in which operation characteristics are improved may mean that a driving current (or switching current) required for writing and erasing of logic information is reduced. In various examples and implementations of the disclosed technology in this patent document, the electronic device may include the semiconductor memory. The semiconductor memory is available at low-current driving.

One implementation of a semiconductor memory according to various examples and implementations of the disclosed technology in this patent document uses a variable resistance element as a storage element. The variable resistance element is an element that exhibits different resistance states of different resistance values and can be operated to switch between different resistance states in response to a bias provided, for example, a current or voltage. The variable resistance element may include variable resistance materials. The variable resistance materials are used in a resistive memory that storage and erasure of the information is formed by changing of resistance characteristics. The variable resistance materials may include various materials used for RRAM, PRAM, FRAM, MRAM, or STTRAM. For example, the variable resistance materials may include metal oxide insulating materials including ferromagnetic materials, transition metal oxide insulating materials or perovskite-based materials, phase change insulating materials including chalcogenide materials and ferromagnetic insulating materials. Various examples and implementations of the disclosed technology in this patent document are described for a case of using a magnetic tunnel Junction (MTJ) in which a tunnel barrier is interposed between two magnetic materials as the variable resistance element.

According to various examples and implementations of the disclosed technology in this patent document, a semiconductor memory including a magnetic tunnel Junction, for example, STTMRAM (Spin transfer torque magnetic RAM) requires a high driving current (or switching current) to reverse the magnetization direction of magnetic materials. For example, a perpendicular magnetic tunnel junction whose magnetic materials have a perpendicular magnetization requires a higher driving current to reverse the magnetization direction. This is because the perpendicular magnetic tunnel junction uses magnetic materials having a high magnetic anisotropy for the thermal stability of the reduced size. Further, when a magnetic field shift occurs by interference between adjacent magnetic materials, the perpendicular magnetic tunnel junction requires more driving current than the case without the magnetic field shift. Thus, it needs to reduce the driving current required for switching between the different resistance states of the magnetic tunnel junction in order to improve operation characteristics of the semiconductor memory having the magnetic tunnel junction.

In light of the above need for reducing the driving current that flows through the variable resistance element for changing its resistance state, various examples and implementations of the disclosed technology in this patent document include, in a variable resistance element, a switching assist structure spaced from the sidewall of a magnetic tunnel junction to surround a magnetic tunnel junction of the variable resistance element. The switching assist structure is designed as an electromagnetic element to produce a desired switching assist magnetic field under a control of a switching assist current that applies to the switching assist structure to produce a switching assist magnetic field as a composite magnetic field around the magnetic tunnel junction in a direction that would help reverse the magnetization direction of the magnetic tunnel junction that is driven by a low driving current through the junction. In the presence of the switching assist structure as disclosed herein, there are two independent magnetization switching mechanisms that collectively operate to cause the switching of the magnetization direction of the variable resistance element: (1) the current-based switching due to the driving current that is directly applied to the variable resistance element to flow through the magnetic tunnel junction of the variable resistance element, and (2) the switching caused by the presence of external magnetic field effect from the switching assist magnetic field generated at the variable resistance element by the switching assist structure as an electromagnet under the control of the switching assist current that applies to the switching assist structure without flowing through the variable resistance element. Due to the additional switching by the switching assist magnetic field from the switching assist structure by the mechanism (2), the magnitude of the current for switching based on the mechanism (1) is reduced in comparison with the needed switching current that flows through the variable resistance element solely under the mechanism (1) without the switching assistance of the mechanism (2).

Therefore, in the combination of the above two mechanisms, the disclosed technology essentially applies a FIMS (field-induced magnetization switching) method of reversing the magnetization direction in addition to the existing conventional MRAM and a CIMS (current-induced magnetization switching) method of reversing the magnetization direction in STTMRAM to reduce a driving current required to switch the magnetic tunnel junction. Due to the added switching mechanism (2) by the switching assist structure, the reduced driving current flowing through the junction can also advantageously reduce the interference of adjacent variable resistance elements in any array of such elements. Therefore, in addition to the reduced driving current in the junction, the disclosed technology can also prevent or mitigate interference between adjacent magnetic materials and prevent the undesired magnetic field shift.

Figure 2:
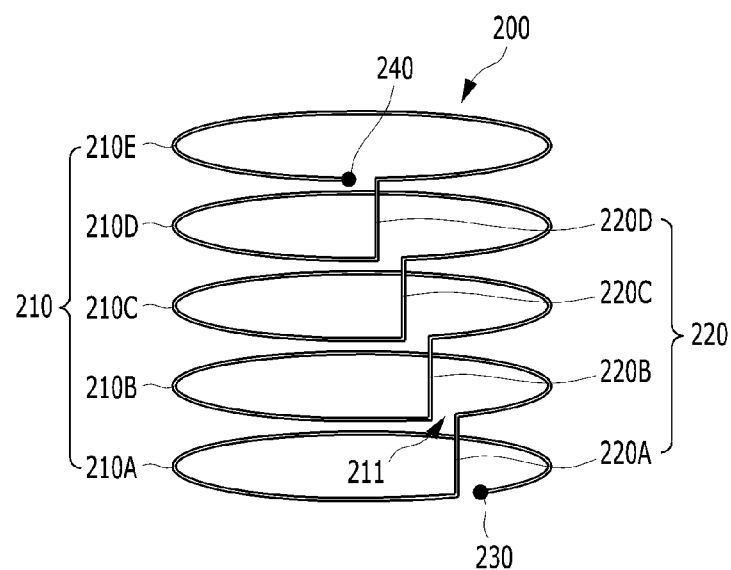
Figure 3:
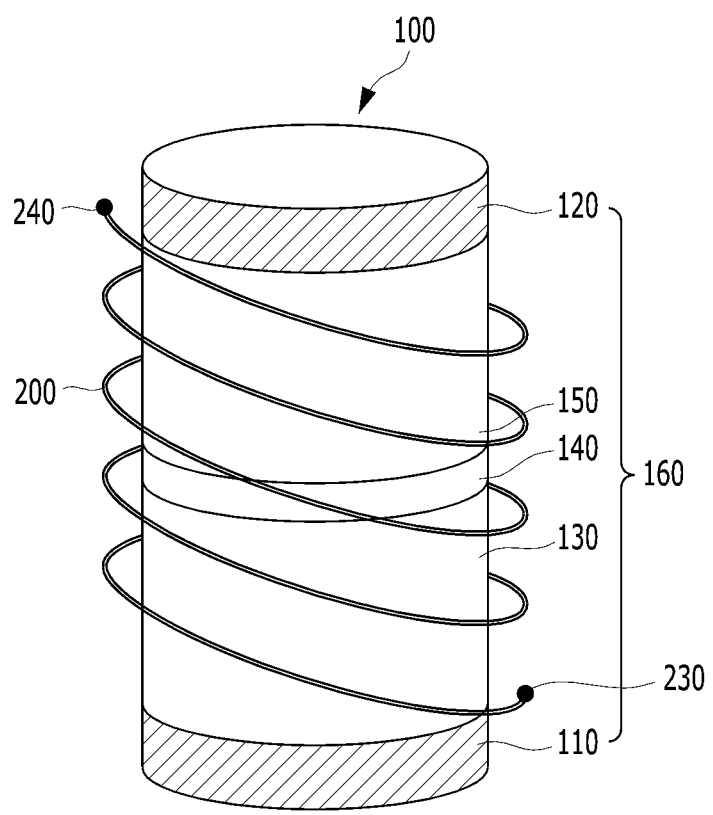
FIG. 3 is a view schematically illustrating an example of a variable resistance element of a semiconductor memory in accordance with a second implementation.
Figure 4:
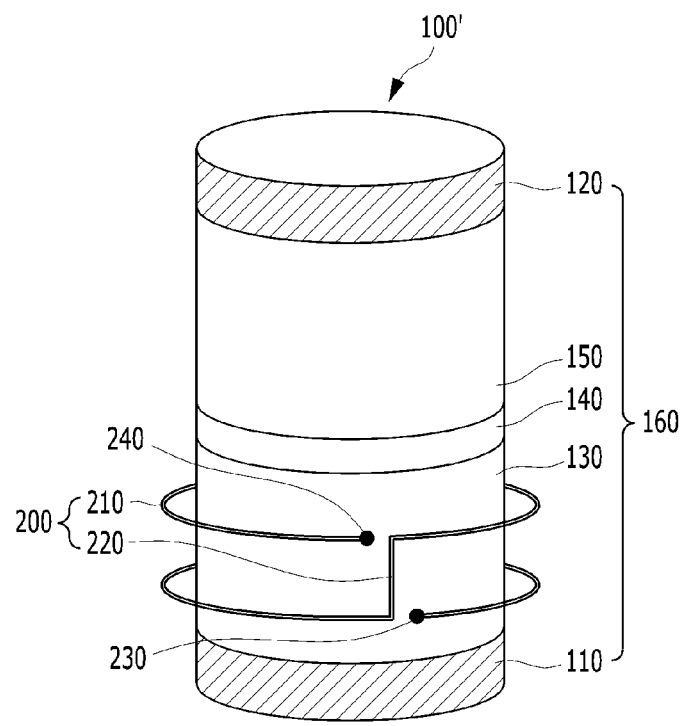
FIGS. 4 through 9 are views schematically illustrating examples of modified variable resistance elements of a semiconductor memory.

FIGS. 1 and 2 illustrate an exemplary variable resistance element and a switching assist structure of a semiconductor memory in accordance with a first implementation. FIG. 3 is an exemplary variable resistance element of the semiconductor memory in accordance with a second implementation. Specifically, FIGS. 1 and 3 are perspective views showing both the respective switching assist structures and the variable resistance patterns 160 and FIG. 2 is a perspective view of a switching assist structure of FIG. 1 only without showing the corresponding variable resistance pattern 160 from FIG. 1.

Referring to FIGS. 1 and 2 according to the first implementation, a variable resistance element 100 of the semiconductor memory includes a variable resistance pattern 160 in which a first electrode layer 110, a variable resistance layer, and a second electrode layer 120 are sequentially stacked so that the variable resistance layer is located between the first and second electrode layers 110 and 120. Notably, the variable resistance element 100 includes a switching assist structure 200 that is separate from but is adjacent to the variable resistance pattern 160 to produce a switching assist magnetic field in the variable resistance pattern 160 that assists with the switching. The switching assist structure 200 is driven by a switching assist current in order to produce the switching assist magnetic field and the switching assist current is separate from the driving current that directly flows through the variable resistance pattern 160 via the two electrode layers 110 and 120. The switching assist structure 200 can be configured to include one or more conductive paths to carry the switching assist current and to produce a desired switching assist magnetic field for switching the magnetization of the variable resistance pattern 160. The one or more conductive paths of the switching assist structure 200 can be implemented in various configurations. As shown by the examples below, the switching assist structure 200 may include multilayered conductive structures which are spaced from a side wall of the variable resistance pattern 160 to surround the variable resistance pattern 160, and vertically spaced from one another. The examples tend to better suited for generating a switching magnetic field with a large magnetic field component along or against the driving current direction through the variable resistance pattern 160 and perpendicular to the first and second electrode layers. Therefore, such examples are suitable for switching a variable resistance pattern 160 having a magnetization of each magnetization layer perpendicular the structure layers. For a variable resistance pattern 160 having an in-plane magnetization that is substantially parallel to the structure layers, the one or more conductive paths of the switching assist structure 200 can be configured to produce a switching magnetic field with a large magnetic field component along or parallel to the structure layers.

In some implementations of the variable resistance pattern 160, the variable resistance layer may include a storage layer 130 on the first electrode layer 110, a tunnel barrier layer 140 on the storage layer 130, and a reference layer 150 on the tunnel barrier layer 140. The variable resistance layer may include the second electrode layer 120 on the reference layer 150. The storage layer 130 and the reference layer 150 may include magnetic materials. The variable resistance pattern 160 may form a magnetic tunnel junction. In some implementations, the reference layer 150 may serve as a pinned layer that the magnetization direction is pinned, and the storage layer 130 may serve as a free layer that the magnetization direction is changed. The storage layer 130 and the reference layer 150 may be a single layer or multi-layers including Fe—Pt alloy, Co—Pd alloy, Co—Pt alloy, Fe—Ni—Pt alloy, Co—Fe—Pt alloy, or Co—Ni—Pt alloy. The tunnel barrier layer 140 through charge (for example, electron) tunneling serves to change the magnetization direction of the free layer. The tunnel barrier layer 140 may include insulating materials. In some implementations, the tunnel barrier layer 140 may be a single layer or multi-layers including oxide of MgO, MgON, $Al_2O_3$, CaO, SrO, TiO, VO or NbO.

The switching assist structure 200 serves to reduce a driving current (or switching current) that is directed to flow through the variable resistance pattern 160 required for switching of the variable resistance pattern 160, for example, the magnetic tunnel junction between different resistance states by forming a composite magnetic field. To form the composite magnetic field that the magnetic force is provided in a predetermined direction, the switching assist structure 200 may have a single conductive line shape which surround the variable resistance pattern 160 and provide current flowing in one direction, for example, from the reference layer 150 toward the storage layer 130. The switching assist structure 200 may include one end as a first node 230 and the other end as a second node 240. A switching assist current is supplied to the switching assist structure 200 via the nodes 230 and 240 and the magnitude and the direction of this switching assist current are controlled by achieve a desired operation in connection with a separate driving current directed through the layers 130, 140 and 150 of the variable resistance pattern 160. The multi-layered conductive structures which are vertically spaced may couple in series between the first node 230 and the second node 240. The first node 230 and the second node 240 may be electrically coupled to the first electrode layer 110 or the second electrode layer 120 of the variable resistance pattern 160. It will be described later on the electrical coupling between the switching assist structure 200 and the variable resistance element 100 (see FIG. 10).

A switching assist structure 200 may include a plurality of ring-type conductive layers 210 vertically spaced from one another and a plurality of electrically conductive connectors or plugs 220 which electrically couple the plurality of ring-type conductive layers, i.e., electrically connecting the different ring-type conductive layers 210 to form a contiguous electrical path via the different ring-type conductive layers 210. In some implementations, the switching assist structure 200 including the plurality of ring-type conductive layers 210 and the plurality of electrical connectors or plugs 220 may have a spiral shape as illustrated in FIG. 3.

Each of the plurality of ring-type conductive layers 210 may have a discontinuous shape having an opening portion 211. For example, each of the plurality of ring-type conductive layers 210 may have a "C" shaped cross section. In this case, one side of a ring-type conductive layer 201 has two separate portions spaced to face to each other. The ring-type conductive layers 210 and the inter-layer connectors 220 form a coil structure with multiple coils to collectively generate a desired switching magnetic field along the axial direction of the coil structure. The variable resistance pattern 160 is enclosed within this coil structure or surrounded by the coils. Different variable resistance patterns 160 of a memory array have their corresponding coil structures.

The plurality of electrical connectors or plugs 220 may electrically couple the plurality of ring-type conductive layers 210 vertically spaced such that the switching assist structure 200 serves as a single conductive line that a current flows in one direction. Therefore, the plurality of electrical connectors or plugs 220 may couple the plurality of ring-type conductive layers 210 such that the current flows in the same direction through the plurality of ring-type conductive layers 210. For example, referring to FIG. 2, when a first conductive layer 210A to a fifth conductive layer 210E are vertically spaced, an electrical connector or plug (for example, a first electrical connector or plug 220A) on a Nth conductive layer (for example, a first conductive layer 210A couples between the Nth conductive layer) and a N+1th conductive layer (for example, a second conductive layer 210B) may couple one end of the Nth conductive layer and the other end of the N+1th conductive layer.

As described above, the variable resistance element 100 may reduce the driving current required for switching the variable resistance element 100 by including the switching assist structure 200 which surrounds the variable resistance pattern 160.

Herein after, modified variable resistance elements 100 in accordance with the first implementation will be described in detail with reference to FIGS. 4 to 9. For clarity, the first implementation will be exemplarily described. However, the modifications to be described later may be applied to a variable resistance element 100' in accordance with a second implementation.

FIGS. 4 to 9 are views schematically illustrating modified variable resistance elements of a semiconductor memory in accordance with the first implementation.

Figure 5:
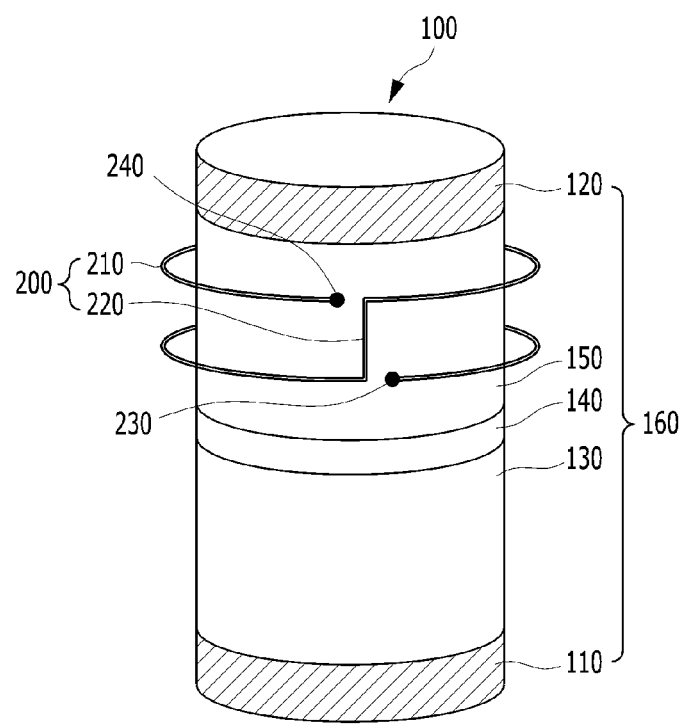
Figure 6:
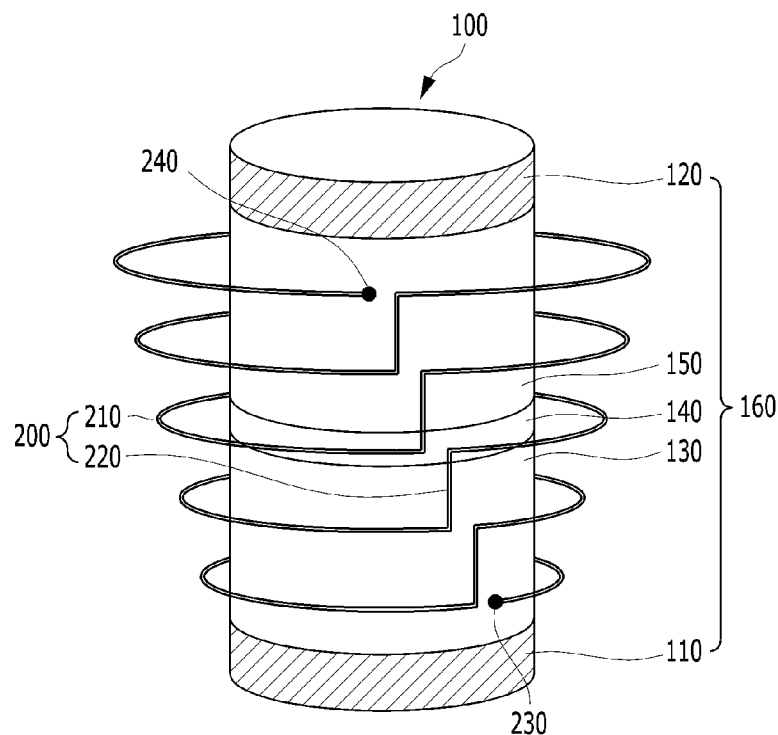
Figure 7:
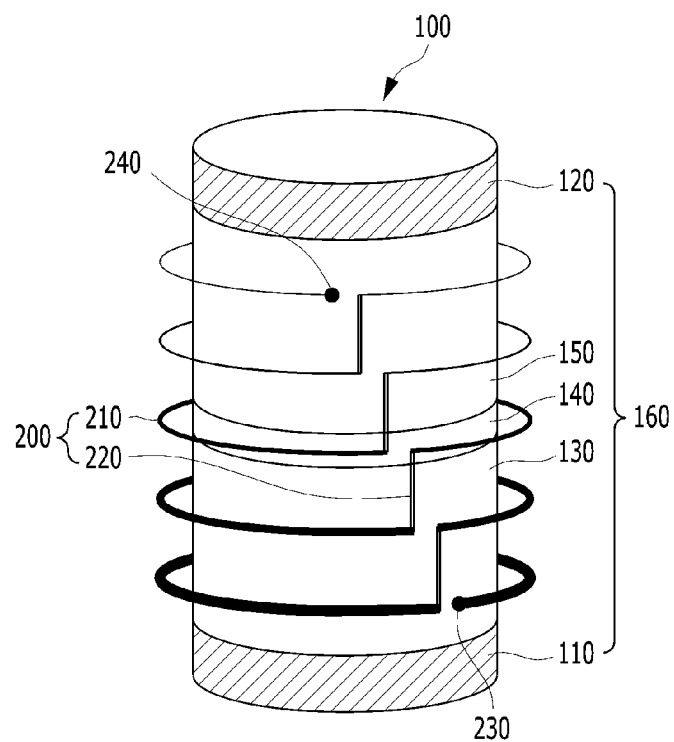
Figure 8:
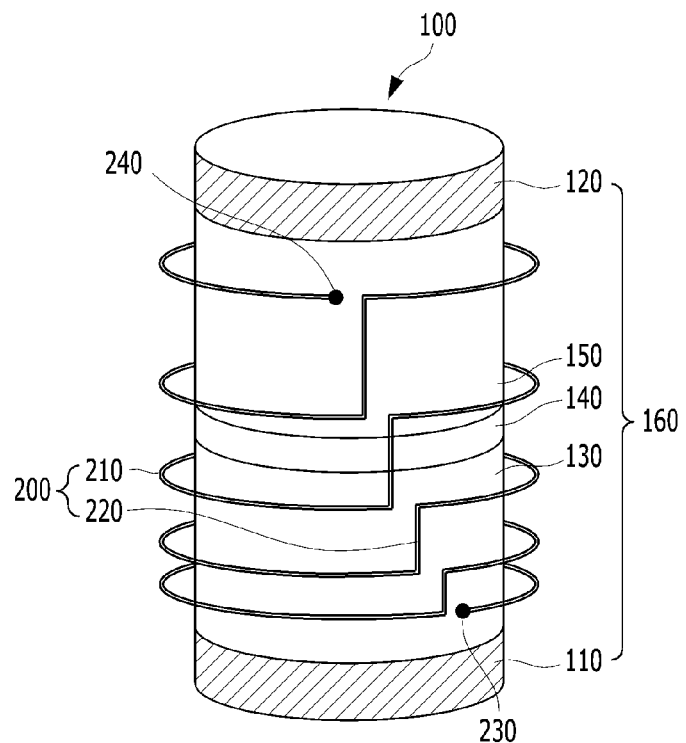
Figure 9:
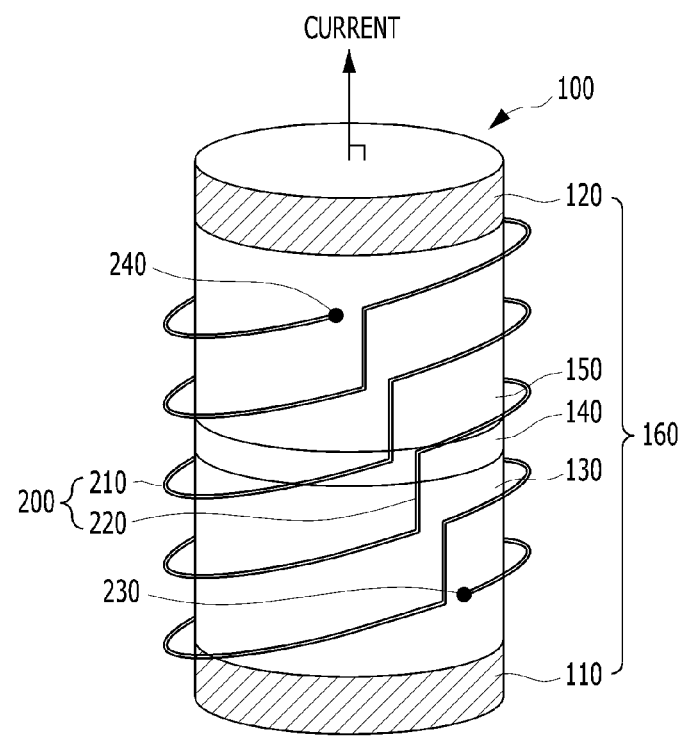

A switching assist structure 200 according to the first implementation surrounds the variable resistance pattern 160 including both the storage layer 130 and the reference layer 150. As a modification of the first implementation, referring to FIG. 4, a switching assist structure 200 may surround at least the storage layer 130. Referring to FIG. 5, the switching assist structure 200 may surround at least the reference layer 150. Here, the switching assist structure 200 surrounding the storage layer 130 may reduce a driving current of the variable resistance element 100 by easily reversing the magnetization of the storage layer 130. The switching assist structure 200 surrounding the reference layer 150 may reduce the driving current of the variable resistance element 100 by suppressing interference, for example, the magnetic field shift due to the magnetic field of the reference layer 150.

In the switching assist structure 200 according to the first implementation, all the plurality of ring-type conductive layers 210 surrounding the variable resistance pattern 160 have the same inner diameter. As a modification of the first implementation, referring to FIG. 6, a plurality of ring-type conductive layers 210 surrounding a variable resistance pattern 160 may have different diameters from one another. In some implementations, the inner diameter gradually increases from a first electrode layer 110 to a second electrode layer 120 direction, or vice versa. In some implementations, the plurality of ring-type conductive layers 210 surrounding a storage layer 130 has the same inner diameter (a first inner diameter) and the plurality of ring-type conductive layers 201 surrounding a reference layer 150 has the same inner diameter (a second inner diameter), while the first inner diameter is smaller than the second inner diameter, or vice versa. For example, in the switching assist structure 200, to reduce a driving current of the variable resistance element 100 by easily reversing the magnetization of the storage layer 130, inner diameters of one or more of the ring-type conductive layers 210 which surround the storage layer 130 may be smaller than those of one or more of the ring-type conductive layers which surround the reference layer 150.

In the switching assist structure 200 according to the first implementation, all the plurality of ring-type conductive layer 210 surrounding the variable resistance pattern 160 has the same thickness. As a modification of the first implementation, referring to FIG. 7, a plurality of ring-type conductive layers 210 surrounding a variable resistance pattern 160 may be different from one another in thicknesses. For example, the thickness gradually increases along a direction from a second electrode layer 120 to a first electrode layer 110, or vice versa. In some implementations, the plurality of ring-type conductive layers 210 surrounding a storage layer 130 have the same thickness (a first thickness) and the plurality of ring-type conductive layers 210 surrounding a reference layer 150 have the same thickness (a second thickness), while the first thickness is greater than the second thickness, or vice versa. For example, in the switching assist structure 200, to reduce a driving current of the variable resistance element 100 by easily reversing the magnetization of the storage layer 130, thicknesses of one or more of the ring-type conductive layers 210 which surround the storage layer 130 may be greater than those of one or more of the ring-type conductive layers 210 which surround the reference layer 150.

In the switching assist structure 200 according to the first implementation, all the plurality of ring-type conductive layers 210 of surrounding the variable resistance pattern 160 are arranged at the same interval. As a modification of the first implementation, referring to FIG. 8, a plurality of ring-type conductive layers 210 surrounding a variable resistance pattern 160 may be arranged at the different intervals from one another. For example, the interval between two adjacent ring-type conductive layers 210 varies. For example, the interval between two adjacent ring-type conductive layers 210 gradually increases in a direction from a first electrode layer 110 to a second electrode layer 120, or vice versa. In some implementations, the plurality of ring-type conductive layers surrounding a storage layer 130 may have the same space (a first interval) and the plurality of ring-type conductive layer surrounding a reference layer 150 may have the same space (a second interval), while the first interval is smaller than the second interval, or vice versa. For example, in the switching assist structure 200, to reduce a driving current of the variable resistance element 100 by easily reversing the magnetization of the storage layer 130, the interval between the ring-type conductive layers 210 which surround the storage layer 130 may be smaller than the interval between the ring-type conductive layers 210 which surround the reference layer 150.

In the switching assist structure 200 according to the first implementation, the plurality of ring-type conductive layers 210 which surround the variable resistance pattern 160 may be arranged to be perpendicular to a direction of current passing through the variable resistance pattern 160. As a modification of the first implementation, referring to FIG. 9, a plurality of ring-type conductive layers 210 which surround a variable resistance pattern 160 may be arranged to have a slope with respect to a current direction. In some implementations, the slope may be in a range of from 15° to 75° with respect to the current direction. The magnetic force required for reversing the magnetization direction becomes the smallest when the slope is 45° as compared when the switching assist structure 200 is arranged perpendicular or parallel to the current direction.

As described above, the variable resistance element 100 including the switching assist structure 200 according to the first implementation may be variously modified and each of the modified examples may be combined with each other. For example, the plurality of ring-type conductive layers 210 which are spaced from each other in the switching assist structure 200 may have different inner diameters and be arranged at different intervals. The driving current of the variable resistive element 100 may be more effectively reduced through the above described structure.

Figure 10:
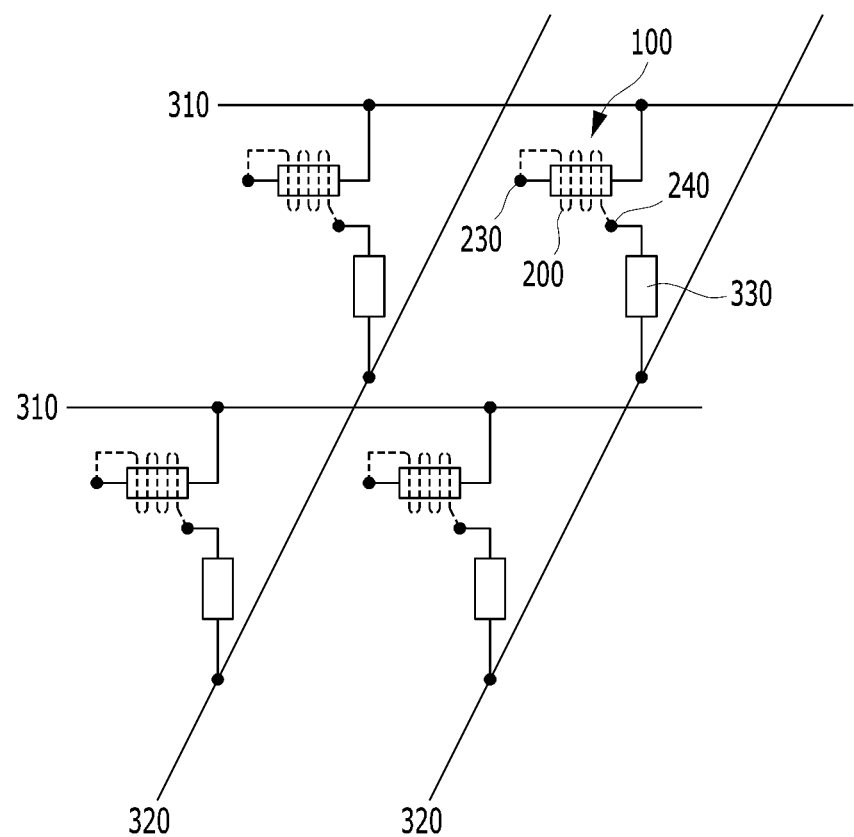
FIG. 10 is an equivalent circuit diagram illustrating an example of a semiconductor memory in accordance with an implementation.

FIG. 10 is an equivalent circuit diagram illustrating a semiconductor memory in accordance with an implementation for supplying both (1) a switching current that directly flows through each variable resistance pattern 160 of a memory cell of a memory array and (2) a switching assist current that flows through only the switching assist structure 200. To simply the illustration, FIG. 10 shows only the circuitry part that supplies the switching assist current through each switching assist structure 200 when a selection element 330 (e.g., a transistor switch) is controlled to select a particular memory cell.

Referring FIGS. 1 and 10, the semiconductor memory according to an implementation may have a crosspoint cell array structure. For example, the semiconductor memory may include a plurality of first conductive lines 310 and a plurality of second conductive lines 320 that cross each other, and memory cells which are located at the intersections thereof. The memory cell may have a form that the variable resistance element 100 including the switching assist structure 200 and a selection element 330 are coupled in series. Here, the variable resistance element 100 and the selection element 330 may be electrically coupled through the switching assist structure 200.

The first node 230 of the switching assist structure 200 adjacent to the first electrode layer 110 of the variable resistance pattern 160 may be electrically coupled to the variable resistance element 100 or the selection element 330. The second node 240 adjacent to the second electrode layer 120 of the variable resistance pattern 160 may be electrically coupled to the selection element 330 or the variable resistance element 100. Here, the coupled relations of the first node 230 and the second node 240 may be adjusted according to the stacking structure of the variable resistance pattern 160. This is because the current needs to flow in the switching assist structure 200 from the reference layer 150 toward the storage layer 130 in order to reduce a driving current. The direction of the current flowing in the switching assist structure 200 is a current direction when the greatest driving current is necessary, for example, when the magnetization direction of the variable resistance element is switched from the parallel state (low-resistance state) to the antiparallel state (high-resistance state).

For example, when the variable resistance pattern 160 includes the first electrode layer 110, the storage layer 130, the tunnel barrier layer 140, the reference layer 150 and the second electrode layer 120 that are sequentially stacked, the first node 230 of the switching assist structure 200 may be coupled to the first electrode layer 110 of the variable resistance pattern 160, and the second node 240 of the switching assist structure 200 may be coupled to the selection element 330. When the variable resistance pattern 160 includes the first electrode layer 110, the reference layer 150, the tunnel barn er layer 140, the storage layer 130 and the second electrode layer 120 that are sequentially stacked, the first node 230 of the switching assist structure 200 may be coupled to the selection element 330, and the second node 240 of the switching assist structure 200 may be coupled to the first electrode layer 110 of the variable resistance pattern 160.

The selection element 330 may include any element that can control the supply of a current or voltage to the variable resistance element 100. For example, a diode, metal insulator transition (MIT), and a transistor may be employed as the selection element 330. The selection element 330 may be coupled to the second conductive line 320.

As described above, the semiconductor memory may reduce a driving current required for switching the variable resistance element 100 by including the variable resistance element 100 including the switching assist structure 200. Therefore, the semiconductor memory with improved operation characteristics may be provided.

The semiconductor memory in accordance with the implementation of the present disclosure may be applied to diverse electronic devices or systems. FIGS. 11 to 15 show some examples of electronic devices or systems that can implement the semiconductor memory disclosed herein.

Figure 11:
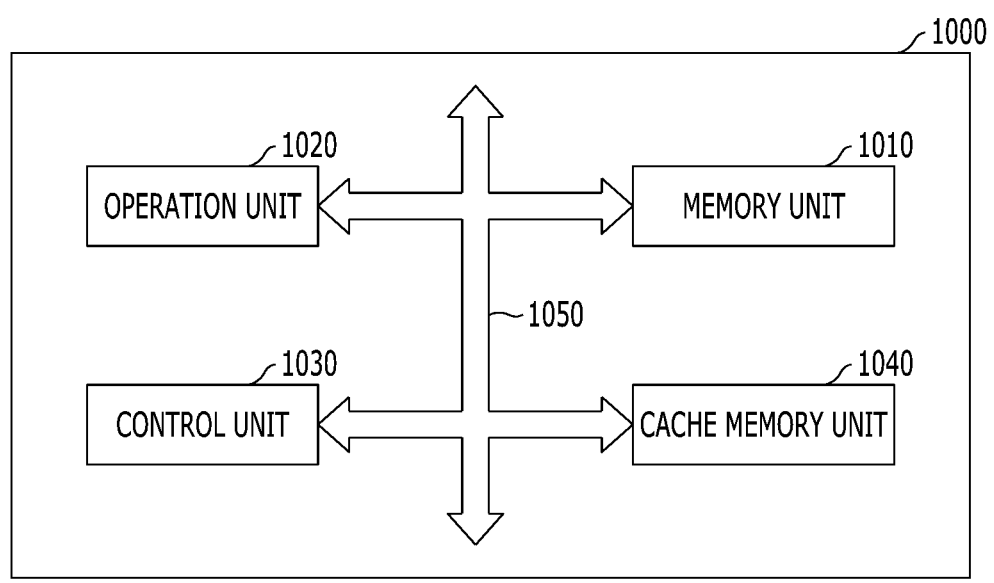
FIG. 11 is an example of configuration diagram of a microprocessor implementing memory circuitry based on the disclosed technology.

Referring to FIG. 11, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. the memory unit 1010 may include semiconductor memory which includes a variable resistance element. The variable resistance element may include a variable resistance pattern in which a first electrode layer, a variable resistance layer and a second electrode layer are sequentially stacked; and a switching assist structure including multilayered conductive structures which are spaced from a side wall of the variable resistance pattern to surround the variable resistance pattern and are vertically spaced from one another. The switching assist structure may have a single conductive line shape in which the multilayered conductive structures are coupled in series between a first node of one end of the switching assist structure and a second node of the other end thereof. The semiconductor memory may reduce a driving current required for switching the variable resistance element by including the variable resistance element including the switching assist structure. Therefore, the semiconductor memory with improved operation characteristics may be provided. Through this, the memory unit 1010 and the microprocessor 1000 may have improved reliability.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 12:
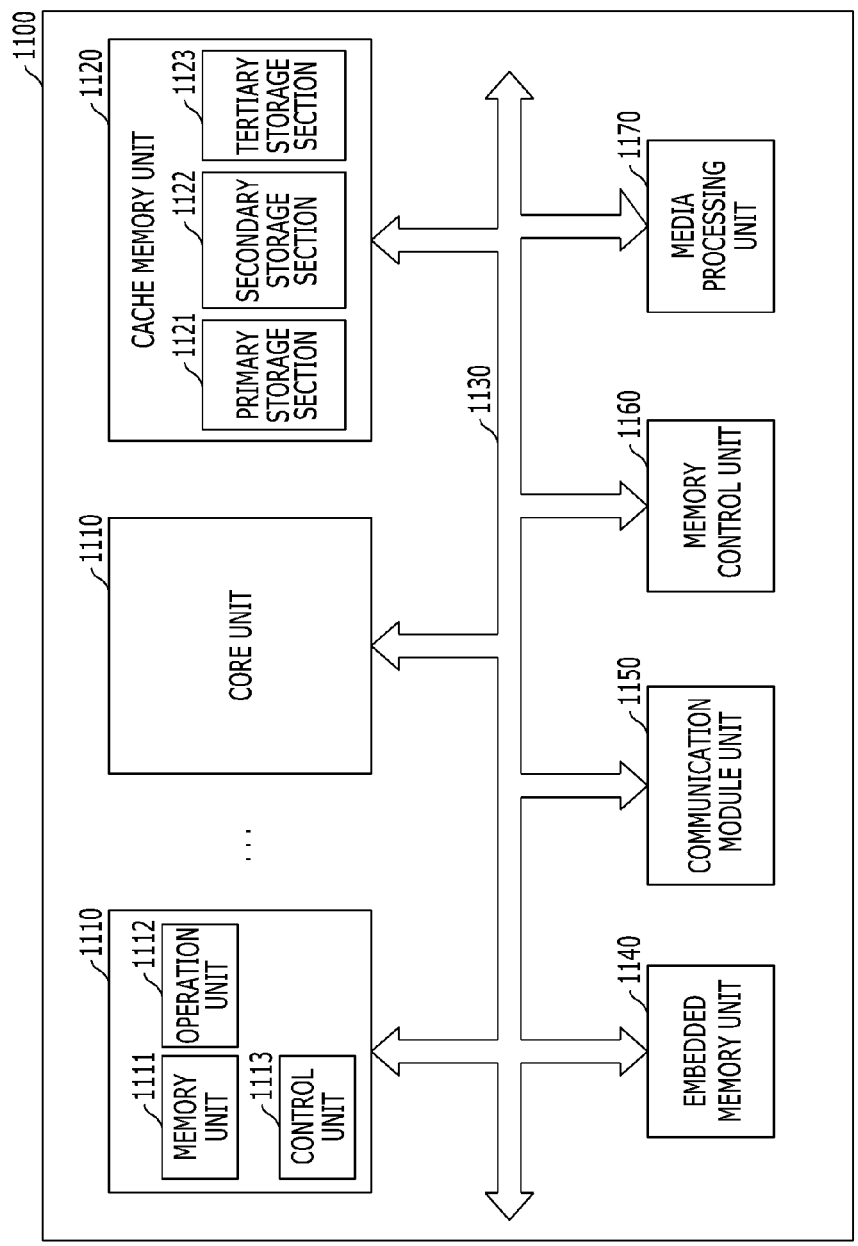
FIG. 12 is an example of configuration diagram of a processor implementing memory circuitry based on the disclosed technology.

FIG. 12 is an example of configuration diagram of a processor implementing memory circuitry based on the disclosed technology.

Referring to FIG. 12, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include semiconductor memory which includes a variable resistance element. The variable resistance element may include a variable resistance pattern in which a first electrode layer, a variable resistance layer and a second electrode layer are sequentially stacked; and a switching assist structure including multilayered conductive structures which are spaced from a side wall of the variable resistance pattern to surround the variable resistance pattern and are vertically spaced from one another. The switching assist structure may have a single conductive line shape in which the multilayered conductive structures are coupled in series between a first node of one end of the switching assist structure and a second node of the other end thereof. The semiconductor memory may reduce a driving current required for switching the variable resistance element by including the variable resistance element including the switching assist structure. Therefore, the semiconductor memory with improved operation characteristics may be provided. Through this, the cache memory unit 1120 and the processor 1100 may have improved reliability.

Although it was shown in FIG. 12 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 13:
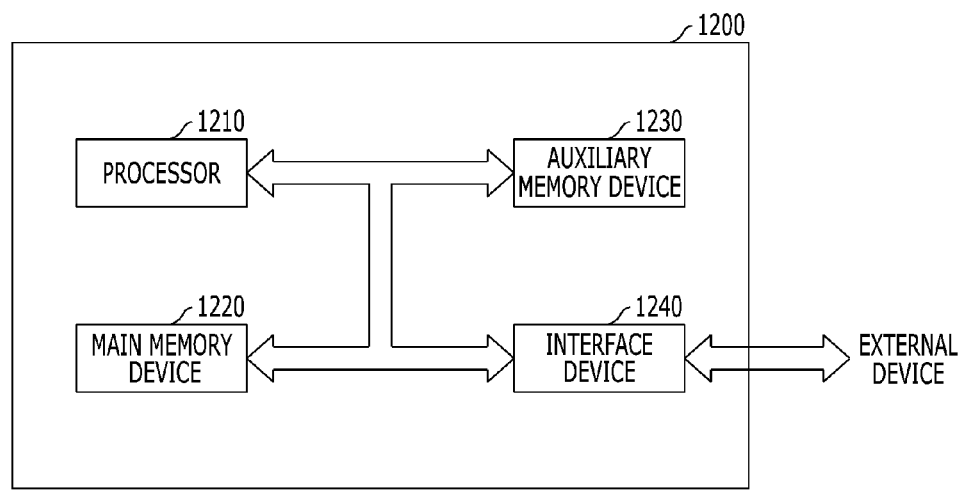
FIG. 13 is an example of configuration diagram of a system implementing memory circuitry based on the disclosed technology.

FIG. 13 is an example of configuration diagram of a system implementing memory circuitry based on the disclosed technology.

Referring to FIG. 13, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include semiconductor memory which includes a variable resistance element. The variable resistance element may include a variable resistance pattern in which a first electrode layer, a variable resistance layer and a second electrode layer are sequentially stacked; and a switching assist structure including multilayered conductive structures which are spaced from a side wall of the variable resistance pattern to surround the variable resistance pattern and are vertically spaced from one another. The switching assist structure may have a single conductive line shape in which the multilayered conductive structures are coupled in series between a first node of one end of the switching assist structure and a second node of the other end thereof. The semiconductor memory may reduce a driving current required for switching the variable resistance element by including the variable resistance element including the switching assist structure.

Therefore, the semiconductor memory with improved operation characteristics may be provided. Through this, the main memory device 1220 and the system 1200 may have improved reliability.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include semiconductor memory which includes a variable resistance element. The variable resistance element may include a variable resistance pattern in which a first electrode layer, a variable resistance layer and a second electrode layer are sequentially stacked; and a switching assist structure including multilayered conductive structures which are spaced from a side wall of the variable resistance pattern to surround the variable resistance pattern and are vertically spaced from one another. The switching assist structure may have a single conductive line shape in which the multilayered conductive structures are coupled in series between a first node of one end of the switching assist structure and a second node of the other end thereof. The semiconductor memory may reduce a driving current required for switching the variable resistance element by including the variable resistance element including the switching assist structure. Therefore, the semiconductor memory with improved operation characteristics may be provided. Through this, the auxiliary memory device 1230 and the system 1200 may have improved reliability.

Also, the auxiliary memory device 1230 may further include a data storage system (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 14:
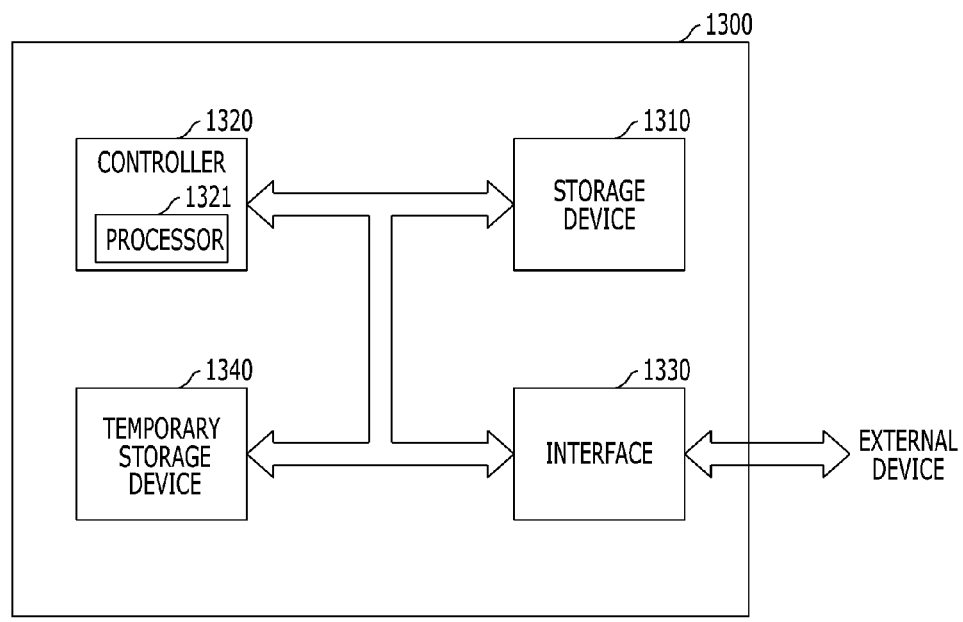
FIG. 14 is an example of configuration diagram of a data storage system implementing memory circuitry based on the disclosed technology.

FIG. 14 is an example of configuration diagram of a data storage system implementing memory circuitry based on the disclosed technology.

Referring to FIG. 14, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include semiconductor memory which includes a variable resistance element. The variable resistance element may include a variable resistance pattern in which a first electrode layer, a variable resistance layer and a second electrode layer are sequentially stacked; and a switching assist structure including multilayered conductive structures which are spaced from a side wall of the variable resistance pattern to surround the variable resistance pattern and are vertically spaced from one another. The switching assist structure may have a single conductive line shape in which the multilayered conductive structures are coupled in series between a first node of one end of the switching assist structure and a second node of the other end thereof. The semiconductor memory may reduce a driving current required for switching the variable resistance element by including the variable resistance element including the switching assist structure. Therefore, the semiconductor memory with improved operation characteristics may be provided. Through this, the temporary storage device 1340 and the data storage system 1300 may have improved reliability.

Figure 15:
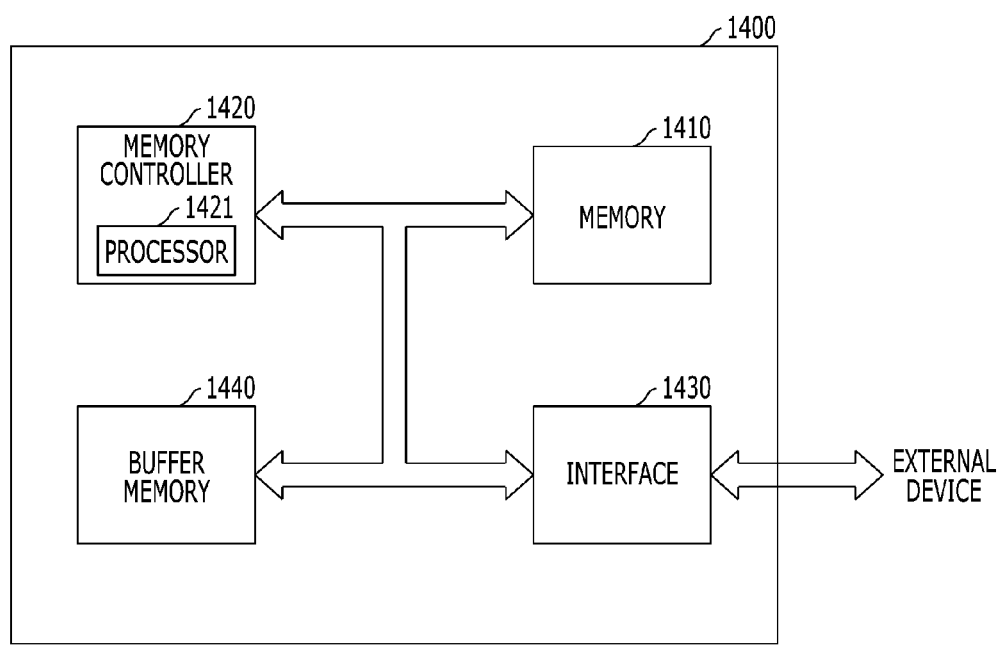
FIG. 15 is an example of configuration diagram of a memory system implementing memory circuitry based on the disclosed technology.

FIG. 15 is an example of configuration diagram of a memory system implementing memory circuitry based on the disclosed technology.

Referring to FIG. 15, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include semiconductor memory which includes a variable resistance element. The variable resistance element may include a variable resistance pattern in which a first electrode layer, a variable resistance layer and a second electrode layer are sequentially stacked; and a switching assist structure including multilayered conductive structures which are spaced from a side wall of the variable resistance pattern to surround the variable resistance pattern and are vertically spaced from one another. The switching assist structure may have a single conductive line shape in which the multilayered conductive structures are coupled in series between a first node of one end of the switching assist structure and a second node of the other end thereof. The semiconductor memory may reduce a driving current required for switching the variable resistance element by including the variable resistance element including the switching assist structure. Therefore, the semiconductor memory with improved operation characteristics may be provided. Through this, the memory 1410 and the memory system 1400 may have improved reliability.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include semiconductor memory which includes a variable resistance element. The variable resistance element may include a variable resistance pattern in which a first electrode layer, a variable resistance layer and a second electrode layer are sequentially stacked; and a switching assist structure including multilayered conductive structures which are spaced from a side wall of the variable resistance pattern to surround the variable resistance pattern and are vertically spaced from one another. The switching assist structure may have a single conductive line shape in which the multilayered conductive structures are coupled in series between a first node of one end of the switching assist structure and a second node of the other end thereof. The semiconductor memory may reduce a driving current required for switching the variable resistance element by including the variable resistance element including the switching assist structure. Therefore, the semiconductor memory with improved operation characteristics may be provided. Through this, the buffer memory 1440 and the memory system 1400 may have improved reliability.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 11 to 15 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory which includes a variable resistance element, the variable resistance element comprising:
a variable resistance pattern including a first electrode layer, a variable resistance layer and a second electrode layer that are sequentially stacked; and
a switching assist structure spaced from a side wall of the variable resistance pattern to surround the variable resistance pattern and including multilayered conductive structures that are vertically spaced from one another.

2. The electronic device of claim 1, wherein one end of the switching assist structure is electrically coupled to the first electrode layer or the second electrode layer.

3. The electronic device of claim 1, wherein the multilayered conductive structures of the switching assist structure each include a single conductive line shape and are coupled in series between a first node of one end of the switching assist and a second node of the other end thereof.

4. The electronic device of claim 3, wherein the switching assist structure has a spiral shape.

5. The electronic device of claim 1,
wherein the switching assist structure includes:
a plurality of ring-type conductive layers, and a plurality of electrically conductive connectors electrically coupled to the plurality of the ring-type conductive layers.

6. The electronic device of claim 5, wherein each of the plurality of ring-type conductive layers includes a "C" shape of which a side of one end is spaced to face a side of the other end.

7. The electronic device of claim 5, wherein the plurality of electrically conductive connectors couple the plurality of ring-type conductive layers such that directions of current flowing through the plurality of ring-type conductive layers are the same with one another.

8. An electronic device comprising:
a variable resistance element including a variable resistance pattern including a first electrode layer and a second electrode layer that are separated from each other to receive a first current to flow through, and a variable resistance layer between the first and second electrode layers to include a storage layer exhibiting a variable magnetization that can be changed by the first current when above a required current value, a reference layer exhibiting a fixed magnetization and spaced from the storage layer, and a tunnel barrier layer between the storage and reference layers, wherein the variable resistance pattern shows different resistance values to the first current based on a direction of the variable magnetization relative to the fixed magnetization; and
a switching assist structure, located adjacent to the variable resistance element, structured to receive a second current and to produce a magnetic field at the variable resistance pattern in response to the second current to assist a switching of the variable magnetization of the variable resistance pattern under a switching operation caused by the first current when under the required current value,
wherein the switching assist structure is spaced from a side wall of the variable resistance pattern to surround the variable resistance pattern.

9. An electronic device comprising:
a variable resistance element including a variable resistance pattern including a first electrode layer and a second electrode layer that are separated from each other to receive a first current to flow through, and a variable resistance layer between the first and second electrode layers to include a storage layer exhibiting a variable magnetization that can be changed by the first current when above a required current value, a reference layer exhibiting a fixed magnetization and spaced from the storage layer, and a tunnel barrier layer between the storage and reference layers, wherein the variable resistance pattern shows different resistance values to the first current based on a direction of the variable magnetization relative to the fixed magnetization; and a switching assist structure, located adjacent to the variable resistance element, structured to receive a second current and to produce a magnetic field at the variable resistance pattern in response to the second current to assist a switching of the variable magnetization of the variable resistance pattern under a switching operation caused by the first current when under the required current value, wherein the switching assist structure comprises:

a plurality of ring-type conductive layers vertically spaced from one another along a direction from the first electrode layer to the second electrode layer of the variable resistance element; and conductive connectors electrically coupling the conductive layers.

10. The electronic device of claim 9, wherein the plurality of ring-type conductive layers and the conductive connectors form a spiral shape.

11. The electronic device of claim 9, wherein each of the conductive layers has a discontinuous shape having an opening portion.

12. The electronic device of claim 9, wherein the plurality of ring-type conductive layers and the conductive connectors surround the variable resistance pattern.

13. The electronic device of claim 9, wherein the ring-type conductive layers have the same inner diameter.

14. The electronic device of claim 9, wherein the ring-type conductive layers have different inner diameters from one another.

15. The electronic device of claim 9, wherein the ring-type conductive layers have the same thickness.

16. The electronic device of claim 9, wherein the ring-type conductive layers have different thicknesses from one another.

17. The electronic device of claim 9, wherein the ring-type conductive layers have the same interval.

18. The electronic device of claim 9, wherein the ring-type conductive layers have different intervals from one another.

19. The electronic device of claim 9, wherein the ring-type conductive layers are formed to have a slope with respect to the direction of the first current passing through the variable resistance pattern.

20. The electronic device of claim 19, wherein the slope is in a range of 15° to 75°.

21. The electronic device of claim 8, wherein the switching assist structure has a shape which surrounds at least the storage layer or at least the reference layer.

22. The electronic device of claim 9, wherein the switching assist structure is spaced from a side wall of the variable resistance pattern to surround the variable resistance pattern.

* * * * *